(12) United States Patent
Lin et al.

(10) Patent No.: US 10,741,563 B2
(45) Date of Patent: Aug. 11, 2020

(54) DYNAMIC RANDOM ACCESS MEMORY

(71) Applicants: Semiconductor Manufacturing International (Shanghai) Corporation, Shanghai (CN); Semiconductor Manufacturing International (Beijing) Corporation, Beijing (CN)

(72) Inventors: Xi Lin, Shanghai (CN); Yi Hua Shen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/582,169

(22) Filed: Sep. 25, 2019

(65) Prior Publication Data
US 2020/0020696 A1    Jan. 16, 2020

Related U.S. Application Data

(62) Division of application No. 15/804,846, filed on Nov. 6, 2017, now Pat. No. 10,475,798.

(30) Foreign Application Priority Data

Nov. 11, 2016 (CN) .......................... 2016 1 0994448

(51) Int. Cl.
*H01L 27/108* (2006.01)
*H01L 45/00* (2006.01)
(Continued)

(52) U.S. Cl.
CPC .. *H01L 27/10879* (2013.01); *H01L 27/10826* (2013.01); *H01L 27/2436* (2013.01);
(Continued)

(58) Field of Classification Search
CPC ............ H01L 27/108; H01L 27/10844; H01L 27/10847; H01L 27/10829; H01L 28/92; H01L 45/16; H01L 28/40; H01L 28/60
See application file for complete search history.

(56) References Cited

U.S. PATENT DOCUMENTS 6,162,679 A    12/2000   Lin et al.
9,401,472 B1    7/2016   Gopalan et al.
(Continued)

FOREIGN PATENT DOCUMENTS

CN    102891110 A    1/2013
WO    2008087499 A1    7/2008

OTHER PUBLICATIONS

The European Patent Office (EPO) The Extended European Search Report for 17200236.2 dated Apr. 5, 2018 15 Pages.

*Primary Examiner* — Thanhha S Pham
(74) *Attorney, Agent, or Firm* — Anova Law Group, PLLC (57) ABSTRACT

A dynamic random access memory (DRAM) is provided and includes a base substrate. The base substrate includes a semiconductor substrate, a plurality of fins formed on the semiconductor substrate, and an isolation structure formed on the semiconductor substrate and covering portions of side surfaces of the plurality of fins. The dynamic random access memory further includes an interlayer dielectric layer formed over the base substrate and covering top surfaces of the plurality of fins and the isolation structure; and a memory structure, formed in an opening passing through the interlayer dielectric layer and each of the plurality of fins, the opening extending to and exposing a top surface of a portion of the isolation structure. The memory structure includes a first conductive layer, a memory medium layer on the first conductive layer, and a second conductive layer on the memory medium layer.

10 Claims, 8 Drawing Sheets

(51) Int. Cl.
*H01L 27/24* (2006.01)
*H01L 49/02* (2006.01)

(52) U.S. Cl.
CPC .............. *H01L 28/92* (2013.01); *H01L 45/04* (2013.01); *H01L 45/06* (2013.01); *H01L 45/124* (2013.01); *H01L 45/16* (2013.01)

(56) References Cited

U.S. PATENT DOCUMENTS

| | | |
|---|---|---|
| 9,659,939 B1 * | 5/2017 | Cao .................... H01L 28/90 |
| 2002/0066921 A1 | 6/2002 | Sitaram et al. |
| 2009/0194814 A1 | 8/2009 | Sugioka |
| 2013/0037912 A1 | 2/2013 | Sun et al. |
| 2013/0148409 A1 | 6/2013 | Chung |

* cited by examiner

DYNAMIC RANDOM ACCESS MEMORY

CROSS-REFERENCES TO RELATED APPLICATIONS

This application is a divisional of U.S. patent application Ser. No. 15/804,846, filed on Nov. 6, 2017, which claims the priority of Chinese patent application No. 201610994448.9, filed on Nov. 11, 2016, the entirety of which is incorporated herein by reference.

FIELD OF THE DISCLOSURE

The present disclosure generally relates to the field of semiconductor manufacturing technologies and, more particularly, relates to a dynamic random access memory (DRAM).

BACKGROUND

Dynamic random access memory (DRAM) often includes a memory cell, including a memory capacitor, and a transistor connected with the memory capacitor. The memory capacitor is used to store data; and the transistor is used to control the data storage of the memory capacitor.

The working mechanism of the DRAM is as the following. The word line of the DRAM is electrically connected to the gate of the transistor in the memory cell to control the "on/off" of the transistor. The source of the DRAM is electrically connected to the source of the transistor to form a current transport path. The drain of the transistor is connected to the memory base substrate to store and/or output data.

Currently, in the commonly used DRAM, the memory capacitor is often designed to be a trench capacitor, or a stacked capacitor. The trench capacitor is buried in a semiconductor substrate. The stacked transistor is stacked on a semiconductor substrate.

However, the fabrication process of the existing DRAM is complicated. The disclosed methods and structures are directed to solve one or more problems set forth above and other problems in the art.

BRIEF SUMMARY OF THE DISCLOSURE

One aspect of the present disclosure includes a method for fabricating a dynamic random access memory (DRAM). The method includes providing a base substrate; forming an interlayer dielectric layer over the base substrate; forming an opening passing through the interlayer dielectric layer; and forming a memory structure, having a first conductive layer, a memory medium layer on the first conductive layer, and a second conductive layer on the memory medium layer, in the opening.

Another aspect of the present disclosure includes a dynamic random access memory (DRAM). The dynamic random access memory includes a base substrate; an interlayer dielectric layer formed over the base substrate; and a memory structure, passing through the interlayer dielectric layer and having a first conductive layer, a memory medium layer on the first conductive layer, and a second conductive layer on the memory medium layer, formed in the opening.

Other aspects of the present disclosure can be understood by those skilled in the art in light of the description, the claims, and the drawings of the present disclosure.

BRIEF DESCRIPTION OF THE DRAWINGS

FIGS. 11-20 illustrate semiconductor structures corresponding to certain stages of another exemplary fabrication process of a DRAM consistent with the disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
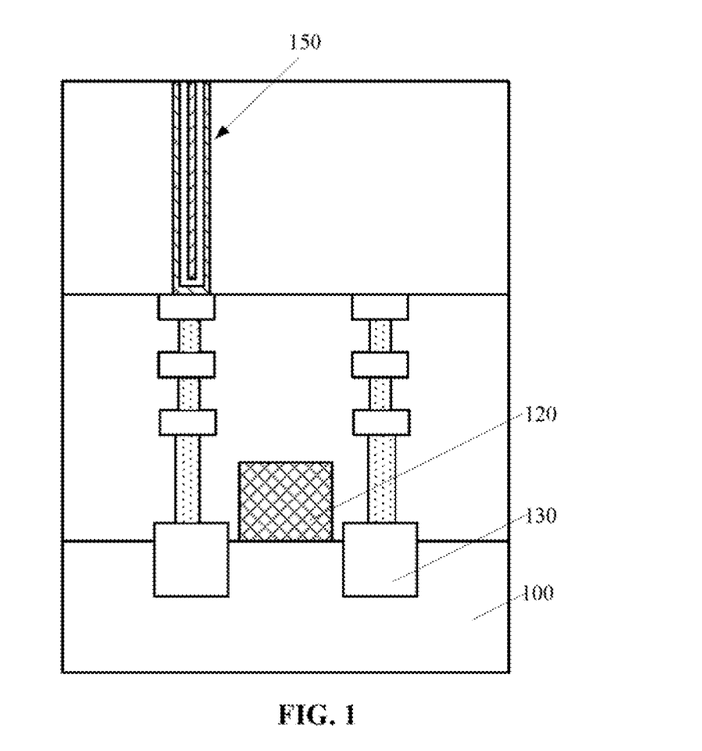
FIG. 1 illustrates a dynamic random access memory (DRAM)

FIG. 1 illustrates a DRAM. As shown in FIG. 1, the DRAM includes a semiconductor substrate 100; a select transistor (not labeled) formed on the semiconductor substrate 100; an interconnect structure (not labeled) formed on the select transistor; a dielectric layer (not labeled) formed on the interconnect structure; a trench (not labeled) passing through the interlayer dielectric layer and exposing the top surface of the interconnect structure formed in the interlayer dielectric layer; and a capacitor (memory) structure 150 formed in the trench.

The capacitor structure 150 includes a first conductive layer formed on the side and bottom surfaces of the trench; a memory medium layer formed on the first conductive layer; and a second conductive layer formed on the memory medium layer.

The select transistor includes a gate structure 100 formed on the semiconductor substrate 100, and doped source/drain regions 130 formed in the semiconductor substrate 100 at two sides of the gate structure 120, respectively. The capacitor structure 150 is connected to the doped source/drain regions 150 by the interconnect structure.

However, the fabrication process of such a DRAM is complicated. For example, to improve the memory properties of the capacitor structure 150, it may need the first conductive layer, the memory medium layer and the second conductive layer to have increased dimensions along a direction perpendicular to the surface of the semiconductor substrate 100. Thus, the depth of the trench has to be increased. The trench having the increased depth requires the interlayer dielectric layer in which the trench is formed to have an increased thickness. The interlayer dielectric layer having the increased thickness may be unsuitable as an interlayer dielectric layer of the front-end-of-line (FEOL) processes. Thus, the capacitor structure 150 cannot be formed during the FEOL processes of the CMOS process. Accordingly, the capacitor structure 150 is formed above the CMOS devices after forming the CMOS devices. Thus, the capacitor structure 150 is not directly in contact with the doped source/drain regions 130. To achieve the electrical connection between the capacitor structure 150 and the doped source/drain regions 130, a multi-layer interconnect structure (not labeled) is needed to be formed between the capacitor structure 150 and the doped source/drain regions 130. Thus, the fabrication process of the DRAM is complicated.

The present disclosure provides a DRAM and a fabrication method thereof. The fabrication method of the DRAM includes providing a substrate. An interlayer dielectric layer may be formed on the base substrate. The method may also include forming an opening passing in the interlayer dielectric layer and in the interlayer dielectric layer; and forming a memory structure in the opening. The memory structure may include a first conductive layer formed on the side and bottom surfaces of the opening, a memory medium layer formed on the first conductive layer, and a second conductive layer formed on the memory medium layer.

In the disclosed methods, the memory structure may be formed in the opening. The memory structure may be formed during the process for forming other CMOS devices. Thus, the fabrication process of the memory structure and the fabrication process of the other CMOS devices may be compatible. Further, it may not need a multiple-layer interconnect structure to electrically connect the memory structure with the select transistor of the DRAM. Thus, the fabrication process of the DRAM may be simplified.

Figure 21:
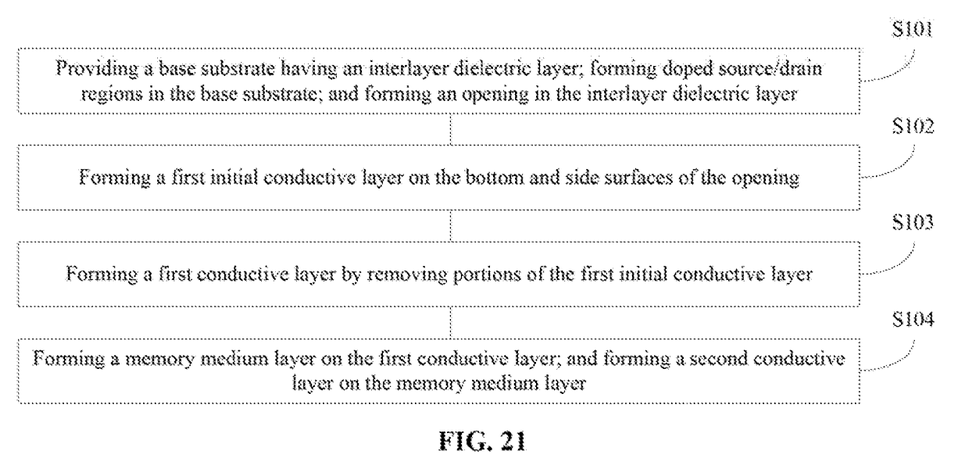
FIG. 21 illustrates an exemplary fabrication process of a DRAM consistent with the disclosed embodiments.

FIG. 21 illustrates an exemplary fabrication process of a DRAM consistent with the disclosed embodiments. FIGS. 2-8 illustrate semiconductor structures corresponding to certain stages of the exemplary fabrication process.

Figure 2:
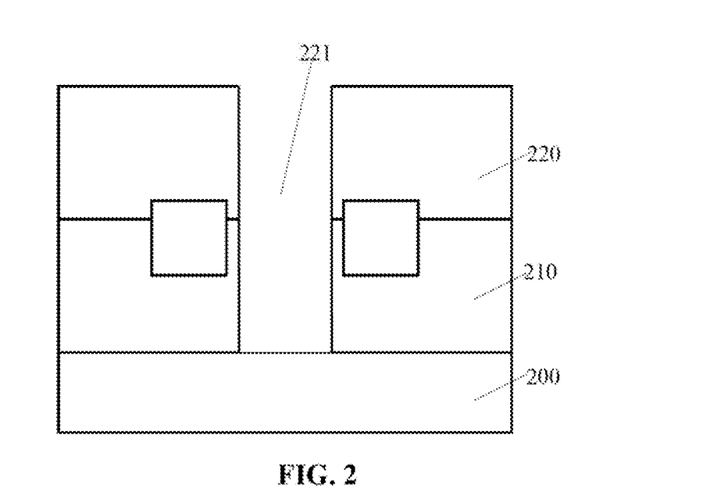
FIGS. 2-8 illustrate semiconductor structures corresponding to certain stages of an exemplary fabrication process of a DRAM consistent with the disclosed embodiments.

As shown in FIG. 21, at the beginning of the fabrication process, a base substrate with certain structures is provided (S101). FIG. 2 illustrates a corresponding semiconductor structure.

As shown in FIG. 2, a base substrate is provided. The base substrate may have an interlayer dielectric layer 220 on its surface. That is, an interlayer dielectric layer 220 may be formed on the surface of the base substrate. Further, source/drain doing regions (not labeled) may be formed in the base substrate.

Further, an opening 221 may be formed in the interlayer dielectric layer 220. The opening 221 may pass through the interlayer dielectric layer 220.

In one embodiment, the base substrate may include a semiconductor substrate 200 and a plurality of fins 210 formed on the semiconductor substrate 200. The semiconductor substrate 200 provides a process platform for forming the DRAM.

The semiconductor substrate 200 may be made of single crystalline silicon, polysilicon, or amorphous silicon. The semiconductor substrate 200 may also be made of other appropriate material, such as silicon, germanium, or silicon germanium, etc. In one embodiment, the semiconductor substrate 200 is made of single crystalline silicon.

In one embodiment, the plurality of fins 210 may be formed by patterning the semiconductor substrate 200. In some embodiments, the plurality of fins may be formed by forming a fin material layer on a semiconductor substrate, followed by patterning the fin material layer.

The number of fins 210 may be equal to, or greater than one. If the number of the fins 210 is greater than one, the distribution direction of the plurality of fins 210 may be perpendicular to the length direction of the plurality of fins 210.

Further, an isolation structure (not shown) may be formed on the semiconductor substrate 200. The isolation structure may cover portions of the side surfaces of the fins 210 parallel to the length direction of the fins 210.

The isolation structure may be made of any appropriate material. In one embodiment, the isolation structure is made of silicon oxide.

In one embodiment, the opening 221 may pass through the interlayer dielectric layer 220 and the fins 210. Such a configuration may provide an increased space for the subsequently formed memory structure; and the performance of the memory structure may be improved.

In one embodiment, the opening 221 may expose portions of the side surfaces of the fins 210 along the length direction of the fins 210.

The process for forming the opening 221 and the interlayer dielectric layer 220 may include forming a dummy gate structure (not shown) over the base substrate. The dummy gate structure may cross over the fins 210 and cover portions of the top and side surfaces of the fins 210. Then, doped source/drain regions (not labeled) may be formed in the base substrate at two sides of the dummy gate structure, respectively. After forming the doped source/drain regions, the interlayer dielectric layer 220 may be formed over the base substrate. The interlayer dielectric layer 220 may cover the side surfaces of the dummy gate structure. Then, the dummy gate structure may be removed to form an initial opening. After forming the initial opening, portions of the fins 210 at the bottom of the initial opening may be removed by an etching process. Thus, the opening 221 passing through the interlayer dielectric layer 220 and the fins 210 may be formed.

The interlayer dielectric layer 220 may be made of any appropriate material, such as silicon oxide, silicon oxynitride, or silicon oxycarbide, etc.

In one embodiment, the interlayer dielectric layer 220 may cover portions of the isolation structure. Thus, the opening 221 may also expose portions of the isolation structure.

Various processes may be used to remove the portions of the fins 210 on the bottom of the initial opening, such as a dry etching process, or a wet etching process, etc. In one embodiment, an anisotropic dry etching process is used to remove the portions of the fins 210 on the bottom of the initial opening.

After forming the opening 221, a memory structure may be formed in the opening 221. The memory structure may include a first conductive layer, a memory medium layer on the first conductive layer, and a second conductive layer on the memory medium layer.

FIGS. 3-8 illustrate semiconductor structures corresponding to certain stages of an exemplary fabrication process of the memory structure.

Figure 3:
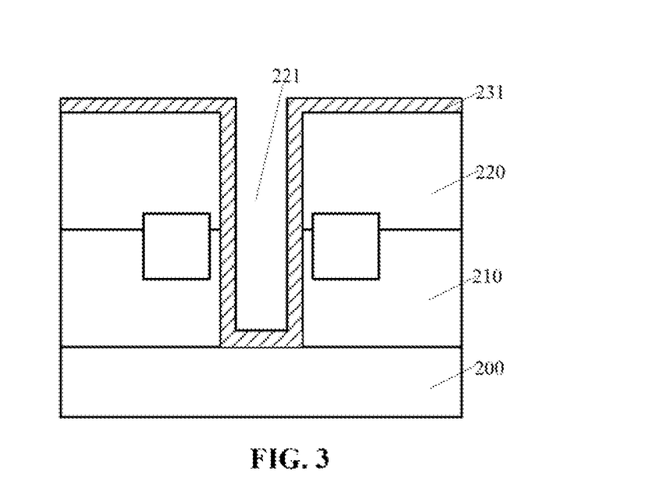

Returning to FIG. 21, after forming the opening 221, a first initial conductive layer may be formed (S102). FIG. 3 illustrates a corresponding semiconductor structure.

As shown in FIG. 3, a first initial conductive layer 231 is formed on the side and bottom surfaces of the opening 231 and the surface of the interlayer dielectric layer 220. The first initial conductive layer 231 may be formed by any appropriate process, such as a deposition process, etc. The deposition process may include a plasma-enhanced chemical vapor deposition (PECVD) process, a low-pressure chemical vapor deposition (LPCVD) process, a sub-atmosphere chemical vapor deposition (SACVD) process, or an atomic layer deposition (ALD) process, etc.

The first initial conductive layer 231 may be made of any appropriate material. In one embodiment, the first initial conductive layer 231 is made of a metal material. The first initial conductive layer 231 may be used to subsequently form a first conducive layer.

In one embodiment, the first initial conductive layer 231 may also cover the isolation structure.

Figure 4:
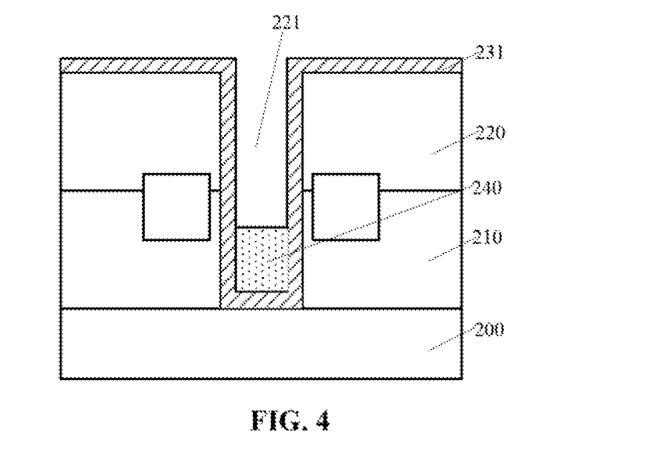
Figure 5:
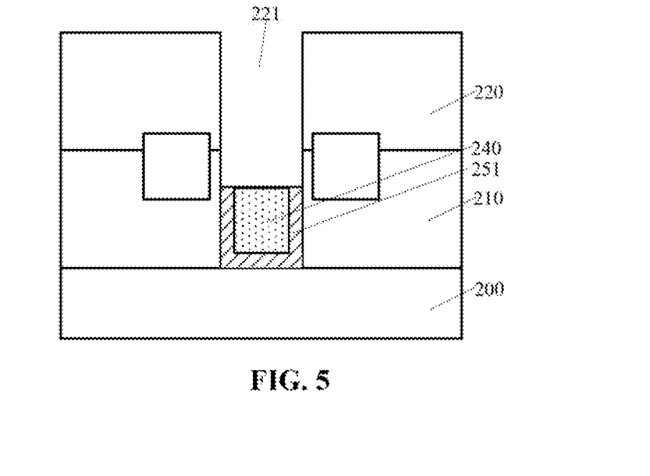
Figure 6:
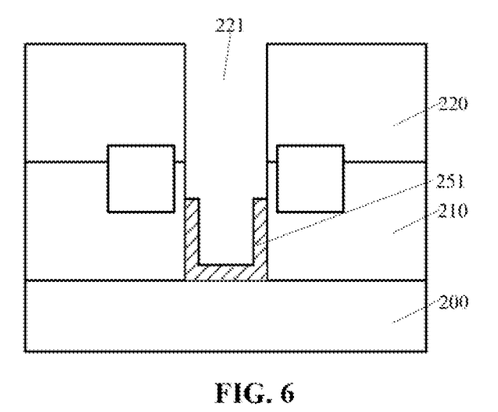

Returning to FIG. 21, after forming the first initial conductive layer 231, a first conductive layer may be formed (S103). The first conductive layer may be formed by removing portions of the first initial conductive layer on the side surface of the opening 221 and the surface of the interlayer dielectric layer 220. FIGS. 4-6 illustrate semiconductor structures corresponding to certain stages of the process for forming the first conductive layer.

As show in FIG. 4, after forming the first initial conductive layer 231, a first filling layer 240 may be formed in the opening 221. The top surface of the first filling layer 240 may be below the top surface of the interlayer dielectric layer 220.

The first filling layer 240 may be made of any appropriate material, such as an organic material, etc. The organic material may include antireflective material, etc.

The process for forming the first filling layer 240 may include forming a first initial filling layer in the opening 221 and on the interlayer dielectric layer 220; and removing the portion of the first initial filling layer on the surface of the interlayer dielectric layer 220 and a top portion of the first initial filling layer in the opening 221. Thus, the first filling layer 240 may be formed.

The first initial filling layer may be formed by any appropriate process. In one embodiment, the first initial filling layer is formed by a spin-coating process.

Further, as shown in FIG. 5, after forming the first filling layer 240, the portion of the first initial conductive layer 231 on the side surface of the opening 221 and the portion of the first initial conductive layer 231 on the interlayer dielectric layer 231 may be removed. Thus, the first conductive layer 251 may be formed.

Further, as shown in FIG. 6, after forming the first conductive layer 251, the first filling layer 240 may be removed. Various processes may be used to remove the first filling layer 240, such as a dry etching process, a wet etching process, or a plasma ashing process, etc.

In one embodiment, as shown in FIG. 6, the first conductive layer 251 may be formed on the bottom surface of the opening 221 and the bottom portion of the side surface of the opening 221. The top surface of the first conductive layer 251 on the side surface of the opening 221 may be below the top surface of the interlayer dielectric layer 220. When a memory medium layer and a second conductive layer are subsequently formed, the memory medium layer may be able to cover the entire first conductive layer 251. Thus, the connect line for connecting the second conductive layer may not need a precise alignment with the second conductive layer to avoid the short-circuit between the second conductive layer and the first conductive layer 251. Thus, the process difficulties may be reduced.

In one embodiment, the surface of the first filling layer 240 may be below, or level with the top surface of the isolation structure (not shown). Correspondingly, the top surface of the first conductive layer 251 on the side surface of the opening 251 may also be below, or level with the top surface of the isolation structure. Thus, when the plurality of fins 210 are distributed along the length direction of the fins 210, the first conductive layer 251 in each of the plurality of fins 210 may be distributed discretely. Accordingly, the first conductive layers 251 may be electrically insulated from each other. Under such a condition, the memory structure corresponding to each of the first conductive layers 251 may work independently.

In some embodiments, the surface of the first filling layer may be above the top surface of the isolation structure and below the top surface of the interlayer dielectric layer. Under such a condition, if the first conductive layers in the plurality of fins are required to be distributed discretely, it may need a separated etching process to remove the portion of the first initial conductive layer above the top surface of the isolation structure.

In one embodiment, the top surface of the first conductive layer 251 on the side surface of the opening 221 is below the top surface of the interlayer dielectric layer 220. After forming the first conductive layer 251, a memory medium layer and a second conductive layer may be formed.

Figure 7:
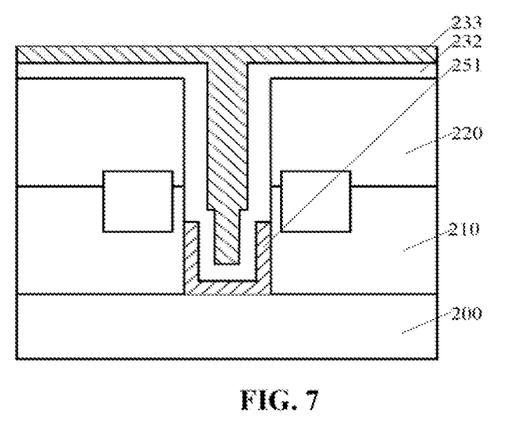
Figure 8:
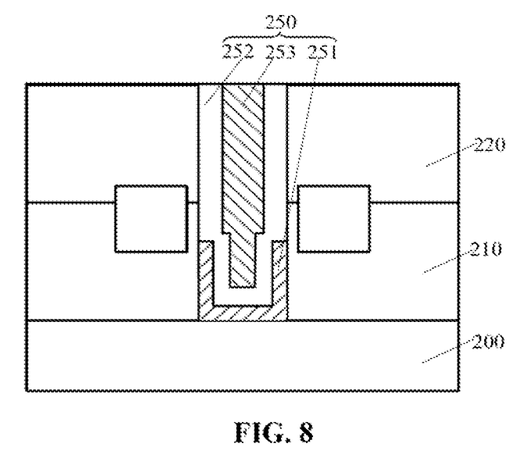

Returning to FIG. 21, after forming the first conductive layer, a memory medium layer and a second conductive layer may be formed (S104). FIGS. 7-8 illustrates semiconductor structure corresponding to certain stages of the fabrication process of the memory medium layer and the second conductive layer.

As shown show in the FIG. 7, the process for forming the memory medium layer and the second conductive layer may include forming a first initial memory medium layer 232 on the surface of the first conductive layer 251, the portion of the side surface of the opening 221 exposed by the first conductive layer 251 and the surface of the interlayer dielectric layer 220; and forming a second initial conductive layer 233 on the first initial memory medium layer 232. After forming the second initial conductive layer 233, as shown in FIG. 8, the portions of the first memory medium layer 232 and the second initial conductive layer 233 above the interlayer dielectric layer 220 may be removed. Thus, the memory medium layer 252 may be formed on the first conductive layer 251; and the second conductive layer 253 may be formed on the memory material layer 252. The first conducive layer 251, the memory medium layer 252 and the second conductive layer 253 may form a memory structure 250.

The first initial memory medium layer 231 may be formed by any appropriate process, such as a deposition process, etc. The deposition process may include a PECVD process, an LPCVD process, an SACVD process, or an ALD process, etc.

The first initial memory medium layer may be made of a resistance-change material, a phase-change material, or a capacitive medium material, etc.

The resistance-change material may include $HfO_2$, ZrO, CuO, or ZnO, etc. The phase-change material may include chalcogenide, or germanium, antimony, and/or tellurium compounds, etc. The capacitive medium material may include HfO, AlO, or ZrO, etc.

The second initial conductive layer 233 may be formed by any appropriate process, such as a deposition process, etc. The deposition process may include a PECVD process, an LPCVD process, an SACVD process, or an ALD process, etc.

The second initial conductive layer 233 may be made of any appropriate material. In one embodiment, the second initial conductive layer 233 is made of a metal material.

Various processes may be used to remove the portions of the first initial memory medium layer 232 and the second initial conductive layer 233 above the interlayer dielectric layer 220, such as a planarization process, etc. The planarization process may include a chemical mechanical polishing process, etc.

When the first initial memory medium layer 232 is made of a resistance-change material, the memory medium layer 252 may be made of a resistance-change material. Correspondingly, the memory structure 250 may be a resistance-change memory structure (RRAM).

When the first initial memory medium layer 232 is made of a phase-change material, the memory medium layer 252 may be made of a phase-change material. Correspondingly, the memory structure 250 may be a phase-change memory structure.

When the first initial memory medium layer 232 is made of a capacitive medium material, the memory medium layer 252 may be made of a capacitive medium material. Correspondingly, the memory structure 250 may be a capacitive medium memory structure.

When the memory medium layer 252 is made of a resistance-change material or a phase-change material, the memory performance of the memory structure 250 may be as desired. The bit-cells in the DRAM having such a memory medium layer 252 may be relatively stable; and may not lose the stored data when the supply power of the DRAM is lost.

In some embodiments, the top surface of the first conductive layer on the side surface of the opening may level with the top surface of the interlayer dielectric layer. Correspondingly, the process for forming the memory structure may include forming a first initial conductive layer on the surface of the interlayer dielectric layer and the side and bottom surfaces of the opening; forming a second initial memory medium layer on the surface of the first initial conductive layer; forming a third initial conductive layer on the second initial memory medium layer; and removing portions of the first initial conductive layer, the second memory medium layer and the third initial conductive layer above the interlayer dielectric layer. Thus, a first conductive layer may be formed on the side and bottom surfaces of the opening; a memory medium layer may be formed on the first conductive layer; and a second conductive layer may be formed on the memory medium layer.

In the disclosed fabrication methods of the DRAM, the memory structure may be formed in the opening. The memory structure may be formed during the CMOS process for forming other devices. The fabrication process of the DRAM and the CMOS process may be compatible. The memory structure and the select transistor of the DRAM may not need a multiple-layer interconnect structure to have an electrical connection. Thus, the fabrication process of the DRAM may be simplified.

Thus, a DRAM may be formed by the disclosed methods and processes. FIG. 8 illustrates a corresponding DRAM.

As shown in FIG. 8, the DRAM includes a base substrate. The base substrate may include a semiconductor substrate 200 and a plurality of fins 210 formed on the semiconductor substrate 200. An interlayer dielectric layer 220 may be formed over the surface of the semiconductor substrate 200. Further, the DRAM may include an opening 221 (referring to FIG. 2) formed in the interlayer dielectric layer 220. The opening 221 may pass through the interlayer dielectric layer 220 and the fins 210. Further, the DRAM may include a memory structure 250 formed in the opening 211. The memory structure 250 may include a first conductive layer 251, a memory medium layer 252 and a second conductive layer 253. The detailed structures and intermediate structures are described above with respect to the fabrication processes.

The first conductive layer 251 may be formed on the side and bottom surfaces of the opening 221.

In one embodiment, the top surface of the first conductive layer 251 on the side surface of the opening 251 may be below the top surface of the interlayer dielectric layer 220. The memory medium layer 252 may also cover a top portion of the side surface of the opening 221.

In some embodiments, the top surface of the first conductive layer on the side surface of the opening may level with the top surface of the interlayer dielectric layer.

In the disclosed DRAM, the memory structure and the select transistor may not need a multiple-layer interconnect structure to have an electrical connection. Thus, the fabrication process of the DRAM may be simplified.

Figure 9:
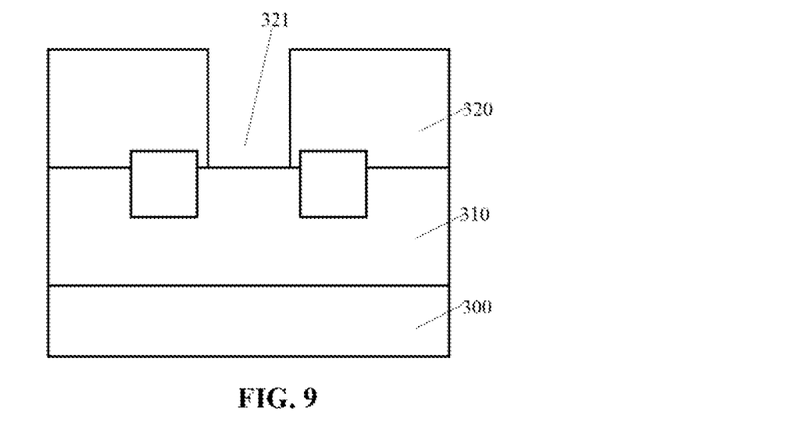
FIGS. 9-10 illustrate semiconductor structures corresponding to certain stages of another exemplary fabrication process of a DRAM consistent with the disclosed embodiments.
Figure 10:
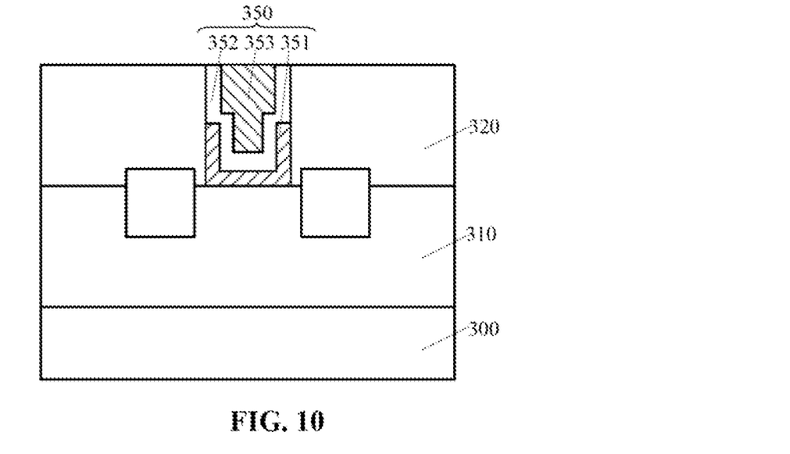

FIGS. 9-10 illustrate semiconductor structures corresponding to certain stages of another exemplary fabrication process of a DRAM consistent with the disclosed embodiments. Comparing with the fabrication process described in FIG. 21, the major differences may include that the opening may only pass through the interlayer dielectric layer.

Specifically, the fabrication process of the DRAM may include providing a base substrate. An interlayer dielectric layer 200 may be formed over the base substrate; and an opening 321 may be formed in the interlayer dielectric layer 200. The opening 321 may pass through only the interlayer dielectric layer.

The base substrate may include a semiconductor substrate and a plurality of fins formed on the semiconductor substrate. The base substrate may also be a planar semiconductor substrate.

In one embodiment, for illustrative purposes, the base substrate includes a semiconductor substrate 300 and a plurality of fins 310 formed on the semiconductor substrate 300.

The function and material of the semiconductor substrate 300 may refer to the description of the semiconductor substrate 200 illustrated in FIG. 2.

The fabrication method, number, material, number and distribution method of the fins 310 may refer to the description of the fins 210 illustrated in FIG. 2.

An isolation structure may be formed on the semiconductor substrate 300. The position and material of the isolation structure may refer to the previous description of the isolation structure formed on the semiconductor substrate 200 illustrated in FIG. 2.

In one embodiment, the opening 321 may only pass through the dielectric layer 320.

Specifically, the process for forming the opening 321 and the interlayer dielectric layer 320 may include forming a dummy gate structure (not shown) over the base substrate; forming doped source/drain regions (not labeled) in the base substrate at two sides of the gate structure, respectively; forming the interlayer dielectric layer 320 over the base substrate and covering the base substrate; and removing the dummy gate structure to form the opening 321 in the interlayer dielectric layer 320.

The interlayer dielectric layer 320 may be made of any appropriate material, such as silicon oxide, silicon oxynitride, or silicon oxycarbide, etc.

After forming the opening 321, as shown in FIG. 10, a memory structure 350 may be formed in the opening 321. The memory structure 350 may include a first conductive layer 351 formed in the opening 321, a memory medium layer 352 formed on the first conductive layer 351, and a second conductive layer 353 formed on the memory medium layer 352.

The first conductive layer 351 may be on the side surface and the bottom surface of the opening 321.

In one embodiment, the top surface of the first conductive layer 351 on the side surface of the opening 321 may be below the top surface of the interlayer dielectric layer 320. The memory medium layer 352 may be on the surface of the first conductive layer 351 and a top portion of the side surface of the opening 321.

The process for forming the memory structure 350 may refer to the process for forming the memory structure 250 illustrated in FIG. 8.

In some embodiments, the top surface of the first conductive layer on the side surface of the opening may level with the top surface of the interlayer dielectric layer. The process for forming such a structure may refer to the previous description.

The material of the first conductive layer 351 may refer to the material of the first conductive layer 251 illustrated in FIG. 8.

The material of the memory medium layer 352 may refer to the material of the memory medium layer 252 illustrated in FIG. 8.

The material of the second conductive layer 353 may refer to the material of the second conductive layer 253 illustrated in FIG. 8.

The present disclosure also provides another DRAM. FIG. 10 illustrates a corresponding DRAM.

As shown in FIG. 10, the DRAM may include a base substrate and an interlayer dielectric layer 320 formed on the base substrate. Further, the DRAM may also include an opening 321 passing through the interlayer dielectric layer formed there-through; and a memory structure 350 formed in the opening 321. The memory structure 350 may include a first conductive layer 351, a memory medium layer 352 and a second conductive layer 353.

The base substrate may include a semiconductor substrate 300 and a plurality of the first fins 310 formed on the semiconductor substrate 300. The base substrate may also be a planar semiconductor substrate.

In one embodiment, the first opening 321 may pass through only the interlayer dielectric layer 320.

The first conductive layer 351 may be on the side surface and the bottom surface of the opening 321.

In one embodiment, the top surface of the first conductive layer 351 on the side surface of the opening 321 may be below the top surface of the interlayer layer dielectric layer 320. The memory medium layer 352 may be on the surface of the first conductive layer 351 and the top portion of the side surface of the opening 321.

In some embodiments, the top surface of the first conductive layer on the side surface of the first opening may level with the top surface of the interlayer dielectric layer.

FIGS. 11-20 illustrate semiconductor structures corresponding to certain stages of another exemplary fabrication process of a DRAM consistent with the disclosed embodiments. Comparing the previously described embodiments, the major differences may include followings. The opening may include opposing first side surfaces and opposing second side surfaces. The second side surfaces may be in contact with the first side surfaces, respectively. The first conductive layers may be formed on the first side surfaces. The memory medium layer may be formed on the first side surfaces, the second side surfaces and the bottom surface of the opening. When the base substrate includes a semiconductor substrate and a plurality of fins, the opening may pass through the fins and the interlayer dielectric layer. The first side surfaces may expose the fins. The descriptions of the structures similar to the previously described structure may be omitted.

Figure 11:
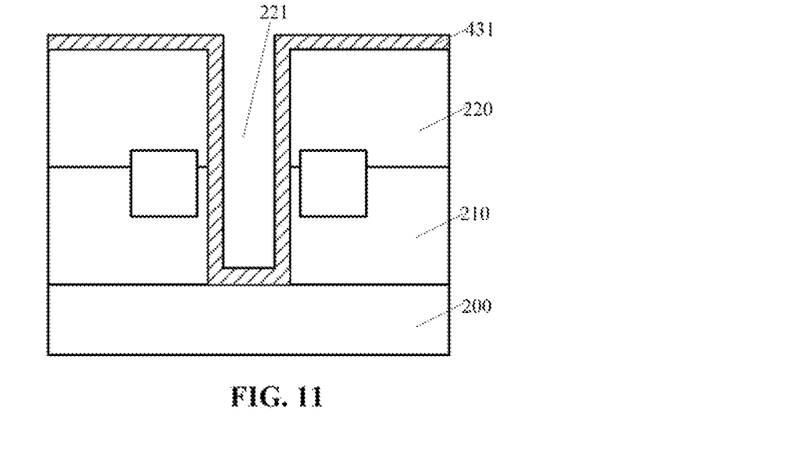

When the base substrate includes a semiconductor substrate and a plurality of fins formed on the semiconductor substrate, and when the opening passes through the interlayer dielectric layer and the fins, the fins may be broken at the opening. First conductive layers may be subsequently formed on the first side surfaces. The fins at the two sides of the opening may be used to form bit-cells, respectively.

For illustrative purposes, the base substrate having the semiconductor substrate and the plurality of fins is described herein. In some embodiments, the base substrate may be a planar semiconductor substrate.

The method for forming a DRAM may include forming a fourth initial conductive layer on the bottom surface, the first side surfaces and the second side surfaces of the opening and the surface of the interlayer dielectric layer; and removing the portions of the fourth initial conductive layer on the bottom surface and the second side surfaces of the opening and on the surface of the interlayer dielectric layer to form first conductive layers. After forming the first conducive layers, a memory medium layer and a second conductive layer may be formed in the opening.

FIGS. 11-18 illustrate structures corresponding to certain stages of the fabrication process of first conductive layers.

As shown in FIG. 11, a fourth initial conductive layer 431 may be formed on the bottom surface, the first side surfaces and the second side surfaces of the opening 221 illustrated in FIG. 2.

The opening 221 may have two opposing first side surfaces and two opposing second side surfaces. The two second side surfaces may be in contact with the first side surfaces, respectively. The first side surfaces may expose the fins 210.

In one embodiment, the opening 221 may also extend to the isolation structure. The opening 221 may expose the top surface of a portion of the isolation structure.

In one embodiment, the second side surface may include a first sub-side surface and a second sub-side surface. The second sub-side surface may expose a portion of the side surface of the interlayer dielectric layer 220.

Specifically, the fourth initial conductive layer 431 may be formed on the bottom surface of the opening 221, the first side surfaces of the opening 221, the second side surfaces of the opening 221, and the portions of the top surface of the isolation structure and the interlayer dielectric layer 220 exposed by the opening 221.

The fourth initial conductive layer 431 may be formed by any appropriate process, such as a deposition process, etc. The deposition process may be a PECVD process, an SACVD process, an LPCVD process, or an ALD process, etc.

The fourth initial conductive layer 431 may be made of any appropriate material. In one embodiment, the fourth initial conductive layer 431 is made of a metal material.

After forming the fourth initial conductive layer 431, the portions of the fourth initial conductive layer 431 on the surface of the interlayer dielectric layer 220, the bottom surface of the opening 221 and the second side surfaces of the opening 221 may be removed. Thus, the first conductive layers may be formed on the two first side surfaces of the opening 221, respectively.

In one embodiment, during the process for removing the portions of the fourth initial conductive layer 431 on the surface of the interlayer dielectric layer 220, the bottom surface of the opening 221 and the second side surfaces of the opening 221, top portions of the initial conductive layer 431 on the first side surfaces may also be removed. Specifically, during the process for removing the portions of the fourth initial conductive layer 431 on the surface of the interlayer dielectric layer 220, the bottom surface of the opening 221 and the second side surfaces of the opening 221, the portions of the initial conductive layer 431 on the top surface of the isolation structure and the top portions of the initial conductive layer 431 on the first side surfaces may be also be removed.

The process for removing the portions of the fourth initial conductive layer 431 on the surface of the interlayer dielectric layer 220, the bottom surface of the opening 221 and the second side surfaces of the opening 221 may include removing the portions of the fourth initial conductive layer 431 on the interlayer dielectric layer 220, on portions of the first side surfaces and portions of the second side surfaces; and removing a portion of the fourth initial conductive layer 431 on the bottom surface of the opening 221 and the remaining portions of the fourth initial conductive layer on the second side surfaces.

FIGS. 12-16 illustrate semiconductor structures corresponding to certain stages of the process for removing the portions of the fourth initial conductive layer 431 on the surface of the interlayer dielectric layer 220, the bottom surface of the opening 221 and the second side surfaces of the opening 221.

Figure 12:
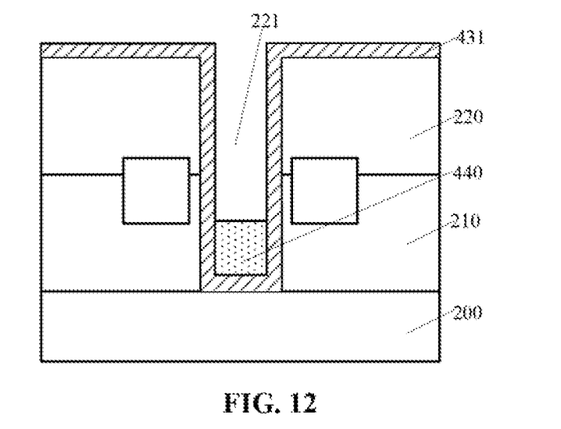

As shown in FIG. 12, a second filling layer 440 may be formed in the opening 221. The surface of the second filling layer 440 may be below the top surface of the interlayer dielectric layer 220.

The material of the second filling layer 440 may refer to the material of the first filling layer 240 illustrated in FIG. 4.

The process for forming the second filling layer 440 may include forming a second initial filling layer in the opening 221 and on the interlayer dielectric layer 220; and removing a portion of the second initial filling layer on the interlayer dielectric layer 220 and a top portion of the second initial filling layer in the opening 221. Thus, the second filling layer 440 may be formed.

The second initial filling layer may be formed by any appropriate process. In one embodiment, the second initial filling layer is formed by a spin-coating process.

In one embodiment, the surface of the second filling layer 440 may be below, or level with the top surface of the isolation structure. In some embodiments, the surface of the second filling layer may be above the isolation structure; and may be below the top surface of the interlayer dielectric layer.

Figure 14:
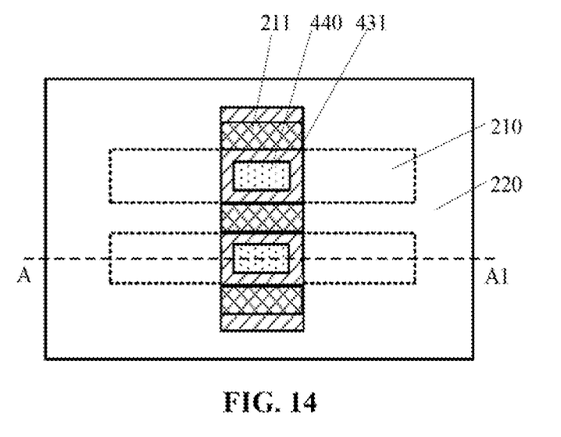

After forming the second filling layer 440, portions of the fourth initial conductive layer 431 on the top surface of the interlayer dielectric layer 220, on portions of the first side surfaces and portions of the second side surfaces may be removed using the second filling layer 440 as a mask. FIGS. 13-14 illustrate a corresponding structure. FIG. 14 is a top view of the structure illustrated in FIG. 13; and FIG. 14 is a cross-sectional view of the structure illustrated in FIG. 13 along the A-A1 direction.

FIG. 14 shows the isolation structure 211. The isolation structure 211 may cover portions of the side surfaces of the fins 210 along a direction parallel to the length direction of the fins 210.

Specifically, the portion of the fourth initial conductive layer 431 on the interlayer dielectric layer 220, portions of the fourth initial conductive layer 431 on the first side surfaces, and at least portions of the fourth initial conductive layer 431 on the second side surfaces may be removed.

In one embodiment, the surface of the second filling layer 440 may be below, or level with the top surface of the isolation structure 211. Correspondingly, the portion of the fourth initial conductive layer 431 on the surface of the interlayer dielectric layer 220, portions of the fourth initial conductive layer 431 on the first side surfaces and the second side surfaces and above the fourth filling layer 440 and the portion of the fourth initial conductive layer 431 on the top surface of the isolation structure 211 may be removed. That is, during the process for removing the portion of the fourth initial conductive layer 431 on the surface of the interlayer dielectric layer 220, and portions of the fourth initial conductive layer 431 on the first side surfaces and the second side surfaces and above the fourth filling layer 440, the portion of the fourth initial conductive layer 431 on the top surface of the isolation structure may also be removed.

In some embodiments, the surface of the second filling layer may be above the top surface of the isolation structure and below the interlayer dielectric layer. Correspondingly, the portion of the fourth initial conductive layer on the interlayer dielectric layer and the portions of the fourth initial conductive layer on the first side surfaces and the second side surfaces and above the second filling layer may be removed. Specifically, the portion of the fourth initial conductive layer on the interlayer dielectric layer and portions of the fourth initial conductive layer on portions of the first side surfaces and portions of the second surfaces may be removed.

Figure 15:
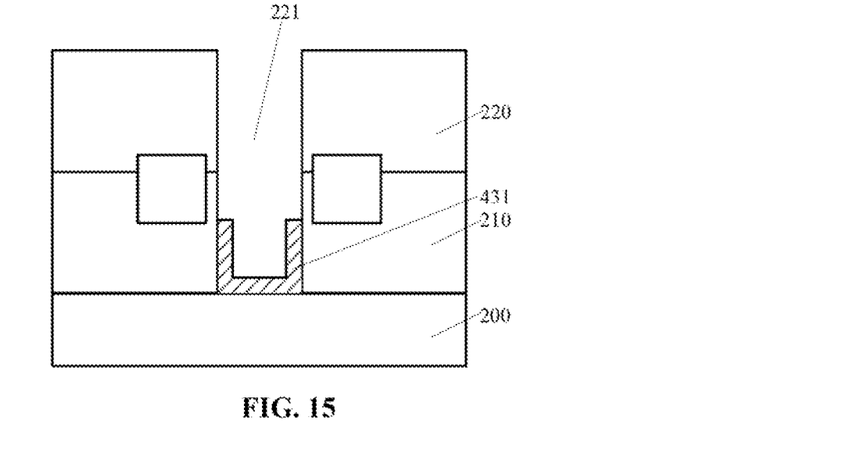
Figure 16:
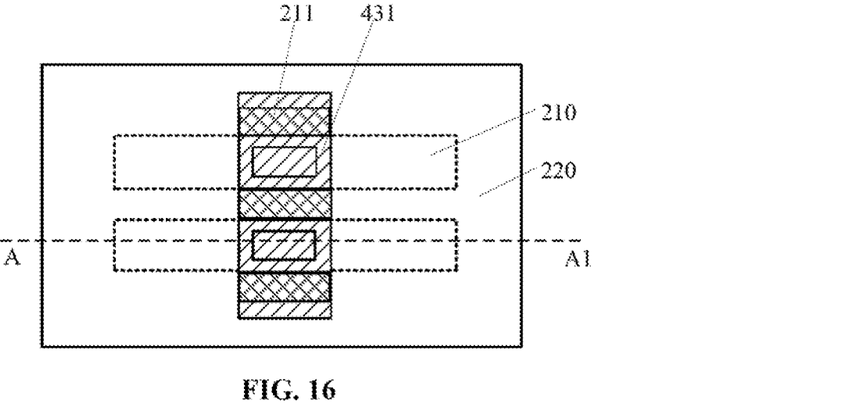

After removing the portion of the fourth initial conductive layer 431 on the surface of the interlayer dielectric layer 220, portions of the fourth initial conductive layer 431 on the first side surfaces and the second side surfaces and above the fourth filling layer 440 and the portion of the fourth initial conductive layer 431 on the top surface of the isolation structure 211, the fourth filling layer 440 may be removed (referring to FIGS. 13-14). FIGS. 15-16 illustrate a corresponding semiconductor structure. FIG. 16 is a top view of the structure illustrated in FIG. 15; and FIG. 15 is a cross-sectional view of the structure illustrated in FIG. 16 along the A-A1 direction.

Figure 17:
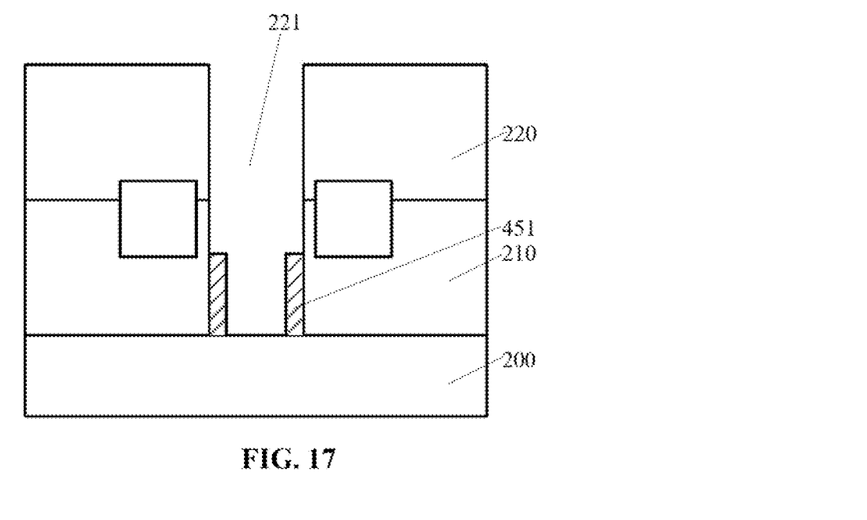
Figure 18:
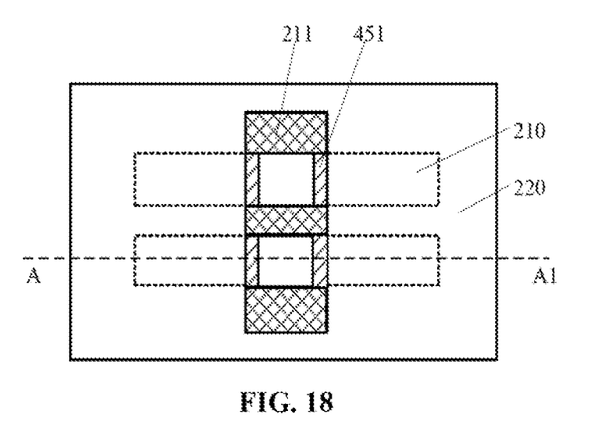

Further, after removing the second filling layer 440, the portion of the fourth initial conductive layer 431 on the bottom surface of the opening 221 and the remaining portions of the fourth initial conductive layer 431 on the second side surfaces may be removed. FIGS. 17-18 illustrate a corresponding semiconductor structure. FIG. 18 is a top view of the structure illustrated in FIG. 17; and FIG. 17 is a cross-sectional view of the structure illustrated in FIG. 18 along the A-A1 direction. After removing the portion of the fourth initial conductive layer 431 on the bottom surface of the opening 221 and the remaining portions of the fourth initial conductive layer 431 on the second side surfaces, the first conductive layers 431 may be formed.

Specifically, the process for removing the portion of the fourth initial conductive layer 431 on the bottom surface of the opening 221 and the remaining portions of the fourth initial conductive layer 431 on the second side surfaces may include forming a patterned photoresist layer. The patterned photoresist layer may cover the portions of the fourth initial conductive layer 431 on the first side surfaces and expose the portion of the fourth initial conductive layer 431 on the bottom surface of the opening 221 and the portions of the fourth initial conductive layer 431 on the second side surfaces. Then, the portion of the fourth initial conductive layer 431 on the bottom surface of the opening 221 and the portions of the fourth initial conductive layer 431 on the second side surfaces may be removed by an etching process using the patterned photoresist layer as an etching mask. Then, the patterned photoresist layer may be removed.

In one embodiment, the surface of the second filling layer 440 may be below, or level with the top surface of the isolation structure 211. Correspondingly, the portions of the fourth initial conductive layer 431 on the first sub-side surfaces and the portion of the fourth initial conductive layer 431 on the bottom surface of the opening 221 may be removed.

In some embodiments, the surface of the second layer may be above the top surface of the isolation structure and below the top surface of the interlayer dielectric layer. Correspondingly, the portion of the fourth initial conductive layer on the bottom surface of the opening, the remaining portions of the fourth initial conductive layer on the second side surfaces and the portion of the fourth initial conductive layer on the top surface of the isolation structure may be removed by an etching process. That is, during the process for removing the portion of the fourth initial conductive layer on the bottom surface of the opening and the remaining portions of the fourth initial conductive layer on the second side surfaces, the portion of the fourth initial conductive layer on the top surface of the isolation structure may be removed.

In one embodiment, the top surface of the first conductive layer 451 may be below the top surface of the interlayer dielectric layer 220. After subsequently forming a memory medium layer and a second conductive layer, the memory medium layer may be able to cover the entire first conductive layer 451. Thus, when the conductive line for connecting the second conductive layer is subsequently formed, it may not need to precisely align the conductive line with the second conductive layer to avoid the short-circuit between the second conductive layer and the first conductive layer 451. Thus, the process difficulties may be reduced.

In one embodiment, the surface of the second filling layer 440 may be below, or level with the top surface of the isolation structure 211. Correspondingly, the top surface of the first conductive layer 451 may be below, or level with the isolation structure 211. Such a configuration may cause the first conductive layer 451 of each of the plurality of fins 210 to be discretely distributed when the plurality of fins 210 are distributed along a direction perpendicular to the length direction of the fins 210. Thus, the first conductive layer 451 of each of the plurality of fins 210 may be electrically isolated. Accordingly, the memory structure corresponding to the first conducive layer 451 of each of the plurality of fins 210 may work independently.

In some embodiments, the surface of the second filling layer may be above the top surface of the isolation structure and may be below the top surface of the interlayer dielectric layer. Under such a condition, if the first conductive layer of each of the plurality of fins is needed to be discretely distributed, an individual etching process is required to remove portions of the fourth initial conductive layer between adjacent fins along the direction perpendicular to the length direction of the fins.

In some embodiments, when the base substrate is a planar semiconductor substrate, if the first conductive layers in the opening need to be discretely distributed, it may need an individual etching process to break the fourth initial conductive layer.

Figure 20:
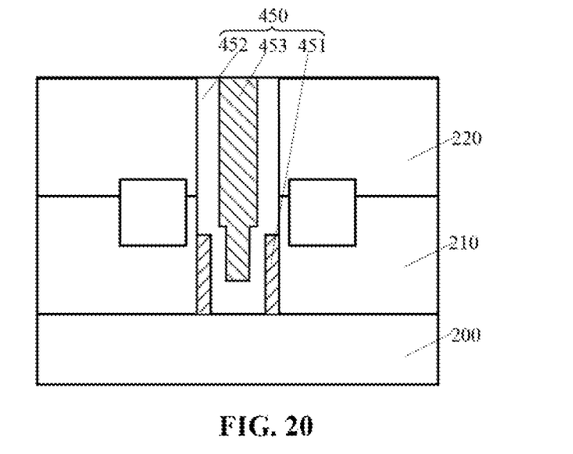

In one embodiment, the top surface of the first conductive layer 451 is below the top surface of the interlayer dielectric layer 220. Correspondingly, as shown in FIG. 20, a memory medium layer 452 may be formed on the surface of the first conductive layers 451, the second side surfaces, portions of the first side surfaces and the bottom surface of the opening 221. Then, a second conductive layer 453 may be formed on the surface of the memory medium layer 452.

Figure 19:
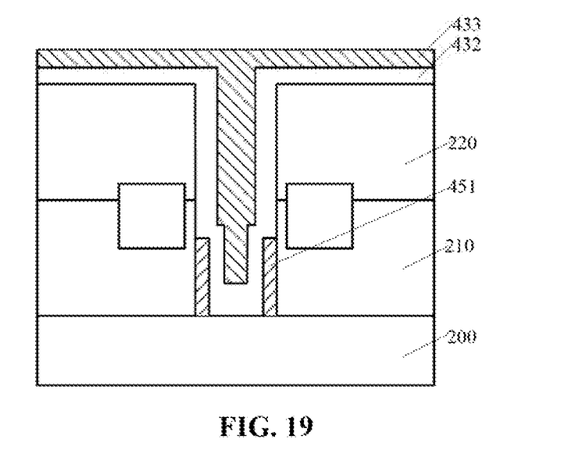

FIGS. 19-20 illustrate semiconductor structures corresponding to certain stages of an exemplary fabrication process of the memory medium layer 452 and the second conductive layer 453.

As shown in FIG. 19, a third initial memory medium layer 432 may be formed on the surfaces of the first conductive layers 451, portions of the first side surfaces exposed by the first conductive layers 451, the second side surfaces and the bottom surface of the opening 221 and the top surface of the interlayer dielectric layer 220. Then, a fifth initial conductive layer 433 may be formed on the second initial memory medium layer 432.

The fabrication process and material of the third initial memory medium layer 432 may refer to the fabrication process and material of the first initial memory medium layer 232 illustrated in FIG. 7. The fabrication process and material of the fifth initial conductive layer 433 may refer to the fabrication process and material of the second initial conductive layer 233 illustrated in FIG. 7.

In one embodiment, the third initial memory medium layer 432 may also be on the top surface of the isolation structure 211.

As shown in FIG. 20, after forming the third initial memory medium layer 432 and the fifth initial conducive layer 433, the portion of the fifth initial conductive layer 433 above the interlayer dielectric layer 220 and the portion of the third initial memory medium layer 432 above the interlayer dielectric layer 220 may be removed. Thus, the memory medium layer 452 and the second conductive layer 453 may be formed.

Various processes may be used to remove the portion of the fifth initial conductive layer 433 above the interlayer dielectric layer 220 and the portion of the third initial memory medium layer 432 above the interlayer dielectric layer 220, such as a planarization process, etc. The planarization process may include a chemical mechanical polishing process, etc.

The first conductive layer 451, the memory medium layer 452 and the second conductive layer 453 may form a memory structure 450.

The material of the memory medium layer 452 may refer to the material of the memory medium layer 252 illustrated in FIG. 8. The type of the memory structure 450 may refer to the type of the memory structure 250 illustrated in FIG. 8.

When the memory medium layer 452 is made of a resistance-change material or a phase-change material, the bit-cells of the memory structure 450 may be stable; and the stored information may not lose when the supply voltage is off. Thus, the memory performance of the memory structure 450 may be as desired.

In some embodiments, after removing the portions of the fourth initial memory medium layer on the interlayer dielectric layer and the bottom of the opening, the portions of the fourth initial memory medium layer on the second side surface may be removed. The top surface of the formed first conductive layers may level with the interlayer dielectric layer. Correspondingly, the memory medium layer may be formed on the first conductive layers, the second side surfaces and the bottom surface of the opening; and the second conductive layer may be formed on the memory medium layer. Under such a configuration, the process for forming the memory medium layer and the second conductive layer may include forming a fourth initial memory medium layer on the surface of the first conductive layers, the second side surfaces, the bottom surface of the opening and the interlayer dielectric layer; forming a sixth initial conductive layer on the fourth initial memory medium layer; and removing the portion of the sixth initial conductive layer above the interlayer dielectric layer and the portion of the fourth initial memory layer above the interlayer dielectric layer. Thus, the memory medium layer and the second conductive layer may be formed.

Specifically, during the process for removing the portion of the sixth initial conductive layer above the interlayer dielectric layer and the portion of the fourth initial memory layer above the interlayer dielectric layer, the portion of the fourth initial conductive layer on the top surface of the isolation may also be removed. The fourth initial memory medium layer may also be formed on the top surface of the isolation structure.

Thus, a DRAM may be formed by the above methods and processes. FIG. 20 illustrates a corresponding DRAM.

As shown in FIG. 20, the DRAM includes a base substrate. An interlayer dielectric layer 220 may be formed on the base substrate. The DRAM may also include an opening 221 (referring to FIG. 2) passing through the interlayer dielectric layer 220 formed in the interlayer dielectric layer 220; and a memory structure 450 formed in the opening 221. The memory structure 450 may include a first conductive layer 451, a memory medium layer 452 on the first conductive layer 451, and a second memory medium layer 452 on the memory medium layer 452.

The base substrate may include a semiconductor substrate 200 and a plurality of fins 210 formed on the semiconductor substrate 200. The base substrate may also be a planar semiconductor substrate.

The openings 211 may have opposing first side surfaces and opposing second side surfaces. The second side surfaces may be in contact with the first side surfaces, respectively. The first conductive layer 451 may be on the first side surface.

When the base substrate includes the semiconductor substrate 200 and the plurality of fins 210 on the semiconductor substrate 200, the opening 221 may pass through the interlayer dielectric layer 220 and the fins 210. The first side surfaces may expose the fins 210.

In one embodiment, the top surface of the first conductive layer 451 may be below the top surface of the interlayer dielectric layer 220. The memory medium layer 452 may be on the surfaces of the first conductive layers 451, the second side surfaces, portions of the first side surfaces and the bottom surface of the opening 221. The second conductive layer 453 may be on the memory medium layer 452.

In some embodiments, the top surface of the first conductive layer may level with the top surface of the interlayer dielectric layer. The memory medium layer may be on the top surfaces of the first conductive layers, the second side surfaces and the bottom surface of the opening. The second conductive layer may be on the surface of the memory medium layer.

In one embodiment, the base substrate may include a memory region and a select region. The memory region may be used to form the disclosed memory structures, or other appropriate memory structure. The select region of the base substrate may be used to form a select transistor. The select transistor and the memory structure may be electrically connected. Specifically, the doped source/drain regions at one side of the memory structure may be electrically connected with the select transistor.

In one embodiment, the memory structure may be formed during the process for forming the select transistor.

Specifically, during the process for forming the dummy gate structure on the base substrate in the memory region, a dummy select gate structure may be formed on the base substrate in the select region. During the process for forming the doped source/drain regions in the base substrate in the memory region at two sides of the dummy gate structure, doped source/drain regions may be formed in the base substrate in the select region at two sides of the dummy select gate structure. Then, the interlayer dielectric layer may be formed on the base substrate at the memory region and the select region. The interlayer dielectric layer may cover the side surfaces of the dummy gate structure and the dummy select gate structure. During the process for removing the dummy gate structure, the dummy select gate structure may be removed; and a select opening may be formed in the interlayer dielectric layer. After removing the dummy gate structure, some intermedia steps for forming the DRAM may be performed until the memory structure is formed; and the select metal gate structure may be formed in the select opening.

The select gate structure may include a select gate dielectric layer formed on the side and bottom surfaces of the select opening, and a select gate electrode layer formed on the select gate dielectric layer.

The material layer of the select gate electrode layer and the material layer of the second conductive layer may be formed simultaneously.

The memory structure may be formed during the process for forming the select gate structure. Thus, the process for forming the memory gate structure and the select gate structure may be compatible. The process for forming the DRAM may be simplified.

Thus, comparing with the existing fabrication technologies of a DRAM, the disclosed methods may have following advantages.

In the disclosed fabrication methods of a DRAM, the memory structure may be formed in the opening. The memory structure may be formed during the CMOS process for forming other devices. Thus, the disclosed fabrication methods of the DRAM may be compatible with the CMOS process. The memory structure and the select transistor of the DRAM may not need to have a multiple-layer interconnect structure to have an electrical connection. Thus, the fabrication process of the DRAM may be simplified.

In the disclosed DRAMs, the memory structure and the select transistor of the DRAM may not need to have a multiple-layer interconnect structure to have an electrical connection. Thus, the fabrication process of the DRAM may be simplified.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A dynamic random access memory, comprising:
   a base substrate, including a semiconductor substrate, a plurality of fins formed on the semiconductor substrate, and an isolation structure formed on the semiconductor substrate and covering portions of side surfaces of the plurality of fins;
   an interlayer dielectric layer formed over the base substrate and covering top surfaces of the plurality of fins and the isolation structure; and a memory structure, formed in an opening passing through the interlayer dielectric layer and each of the plurality of fins, the opening extending to and exposing a top surface of a portion of the isolation structure,
wherein the memory structure includes a first conductive layer, a memory medium layer on the first conductive layer, and a second conductive layer on the memory medium layer.

2. The memory according to claim 1, wherein:
a top surface of the first conductive layer on a side surface of the opening is below a top surface of the interlayer dielectric layer and the memory medium layer covers a portion of the side surface of the opening.

3. The memory according to claim 1, wherein:
a top surface of the first conductive layer on a side surface of the opening leveling with a top surface of the interlayer dielectric layer.

4. The memory according to claim 1, wherein:
the opening has first side surfaces opposing each other and second side surfaces opposing each other;
the first side surfaces are in contact with the second side surfaces, respectively;
the first conductive layer is formed on the first side surface;
the memory medium layer is formed on the first side surfaces, the second side surfaces and the bottom surface of the opening; and
the first side surfaces expose the plurality of fins.

5. The memory according to claim 4, wherein:
the second side surface includes a first sub-side surface and a second sub-side surface;
the first sub-side surface exposes a side surface of the isolation structure; and
the second sub-side surface exposes a portion of the side surface of the interlayer dielectric layer.

6. The memory according to claim 1, wherein:
the memory structure is one of a resistance-change memory structure having the memory medium layer made of a resistance-change material, a phase-change memory structure having the memory medium layer made of a phase-change material, and a capacitive memory structure having the memory medium layer made of a capacitive medium material.

7. The memory according to claim 1, further comprising:
a select transistor electrically connected with the memory structure.

8. The memory according to claim 1, wherein:
the first conductive layer is formed directly on the semiconductor substrate.

9. The memory according to claim 8, wherein:
the first conductive layer exposes a portion of a bottom surface of the opening and the memory medium layer is formed directly on the portion of the bottom surface of the opening.

10. The memory according to claim 1, wherein:
a top surface of the first conductive layer is below a bottom surface of the interlayer dielectric layer.

* * * * *